United States Patent
Hernes

(10) Patent No.: US 10,578,461 B2
(45) Date of Patent: Mar. 3, 2020

(54) CAPACITIVE SENSOR READOUT CIRCUIT

(71) Applicant: Disruptive Technologies Research AS, Rådal (NO)

(72) Inventor: Bjørnar Hernes, Trondheim (NO)

(73) Assignee: Disuptive Technologies Research AS, Radal (NO)

( * ) Notice: Subject to any disclaimer, the term of this patent is extended or adjusted under 35 U.S.C. 154(b) by 211 days.

(21) Appl. No.: 15/400,503

(22) Filed: Jan. 6, 2017

(65) Prior Publication Data

US 2017/0191853 A1  Jul. 6, 2017

Related U.S. Application Data

(60) Provisional application No. 62/275,360, filed on Jan. 6, 2016.

(51) Int. Cl.
*G01R 27/26* (2006.01)
*G01D 5/24* (2006.01)

(52) U.S. Cl.
CPC ..................... *G01D 5/24* (2013.01)

(58) Field of Classification Search
USPC .................................................. 324/658–679
See application file for complete search history.

(56) References Cited

U.S. PATENT DOCUMENTS

| | | | | |
|---|---|---|---|---|
| 4,237,421 A | * | 12/1980 | Waldron | H03K 17/962 307/116 |
| 2008/0079444 A1 | * | 4/2008 | Denison | G01D 5/24 324/679 |
| 2016/0305835 A1 | * | 10/2016 | Kollias | G01L 9/12 |

* cited by examiner

*Primary Examiner* — Vincent Q Nguyen
(74) *Attorney, Agent, or Firm* — McKinney Phillips LLC; Phillip Pippenger

(57) ABSTRACT

A capacitive sensor device is provided. The capacitive sensor device may include a clock module configured to generate a clock signal, a sensor module configured to generate a reference signal and a sense signal, and sample a difference between the reference signal and the sense signal according to the clock signal, and a current supply module configured to selectively generate a bias current according to the clock signal, and charge each of the clock module and the sensor module based on the bias current and according to the clock signal.

14 Claims, 5 Drawing Sheets

CAPACITIVE SENSOR READOUT CIRCUIT

TECHNICAL FIELD

The present disclosure relates generally to capacitive sensors, and more particularly, to readout circuitry for capacitive sensor devices.

BACKGROUND

Capacitive sensor devices, or devices which measure capacitance or a change in capacitance, can be utilized in a wide variety of different fields. This is because various data or parameters that are sought by a given application can be derived based on capacitance or changes therein. For example, capacitive sensors can be used to detect touch, gesture or proximity input in human interface devices, to detect proximity of non-human physical objects, to detect presence and/or volume of water or other liquids, to detect motion, doors and windows for security applications, and any other application that exhibits some change in capacitance. While the following discussion will be directed to non-mechanical human interface devices for simplicity, it will be understood that the same discussions can be implemented for various other uses and applications.

Among various non-mechanical human interface devices used today, capacitive sensor devices are often used to detect and measure touch or proximity input. Typically, a capacitive touch sensor implements analog circuitry which measures changes in capacitance between two or more electrical wires caused by touch or proximity of a person's finger. The resulting analog signal representing the change in capacitance is digitized and post-processed to perform the preprogrammed task desired by the user. Although modern capacitive sensors may be adequate, new challenges surface when working with mobile or battery-operated devices.

Any battery-operated device shares the common goal of providing low power consumption. While capacitive sensors may be modified to reduce power consumption, the general trade-off or concern becomes an undesirable loss in the sensitivity of the capacitive sensor readouts. In a simple example, reductions in sampling frequencies may provide longer battery life, but such reductions may result in significantly delayed responses and frustrating experiences for the user. In addition to reducing power consumption, capacitive sensor circuits must also be cognizant of the sensitivity of the capacitive sensor. For instance, circuit noise, as well as variations in temperature, supply voltage, manufacturing tolerances, and the like, can also adversely affect the ability to detect capacitive sensor input.

There are various schemes available today which measure changes in capacitance sensor input. One technique employs a ring oscillator and a counter, which track changes in oscillator frequency and counter values that result when capacitance changes. A second technique measures a timing delay in a delay chain relative to a reference delay caused by changes in capacitance. A third technique measures changes in capacitance using a form of delta-sigma modulation. A fourth technique employs an operational amplifier, which is used to sample charge transfers between a capacitive sensor and a feedback capacitor. While each technique may provide some benefit, each also has room for improvement.

In particular, the first three conventional techniques noted above rely on overclocking, or require a system clock frequency that is well above the effective sampling rate of the capacitive sensor. While these techniques may provide responsive capacitive sensor circuitry, the overclocking involved is adverse to battery life and power consumption. The fourth conventional technique noted above involves charging the capacitive sensor twice per sample, and tasks the operational amplifier for analog signal processing of the sampling. This technique may provide some improvement over the first three techniques in terms of power consumption, and may help to prolong battery life. However, even the fourth technique can be improved upon to provide still longer battery life.

The present disclosure is directed at addressing one or more of the deficiencies and disadvantages set forth above. However, it should be appreciated that the solution of any particular problem is not a limitation on the scope of this disclosure or of the attached claims except to the extent expressly noted.

SUMMARY OF THE DISCLOSURE

In one aspect of the present disclosure, a capacitive sensor device is provided. The capacitive sensor device may include a clock module configured to generate a clock signal, a sensor module configured to generate a reference signal and a sense signal, and sample a difference between the reference signal and the sense signal according to the clock signal, and a current supply module configured to selectively generate a bias current according to the clock signal, and charge each of the clock module and the sensor module based on the bias current and according to the clock signal.

In another aspect of the present disclosure, another capacitive sensor device is provided. The capacitive sensor device may include a clock circuit configured to generate a clock signal, a reference circuit configured to generate a reference signal, a sense circuit configured to generate a sense signal, a sample circuit configured to sample a difference between the reference signal and the sense signal according to the clock signal, a bias current circuit configured to selectively generate a bias current according to the clock signal, and a multiplier circuit configured to charge each of the clock circuit, the reference circuit, and the sense circuit based on the bias current and according to the clock signal.

In yet another aspect of the present disclosure, a method of sensing a change in capacitance sensitive to capacitive sensor input is provided. The method may include generating a clock signal based on a first capacitance, a reference signal based on a second capacitance, and a sense signal based on a third capacitance, generating a bias current according to the clock signal, charging each of the first capacitance, the second capacitance, and the third capacitance based on the bias current and according to the clock signal, and sampling a difference between the reference signal and the sense signal according to the clock signal.

These and other aspects and features will be more readily understood when reading the following detailed description in conjunction with the accompanying drawings.

While the following detailed description is given with respect to certain illustrative embodiments, it is to be understood that such embodiments are not to be construed as limiting, but rather the present disclosure is entitled to a scope of protection consistent with all embodiments, modifications, alternative constructions, and equivalents thereto.

DETAILED DESCRIPTION

Figure 1:
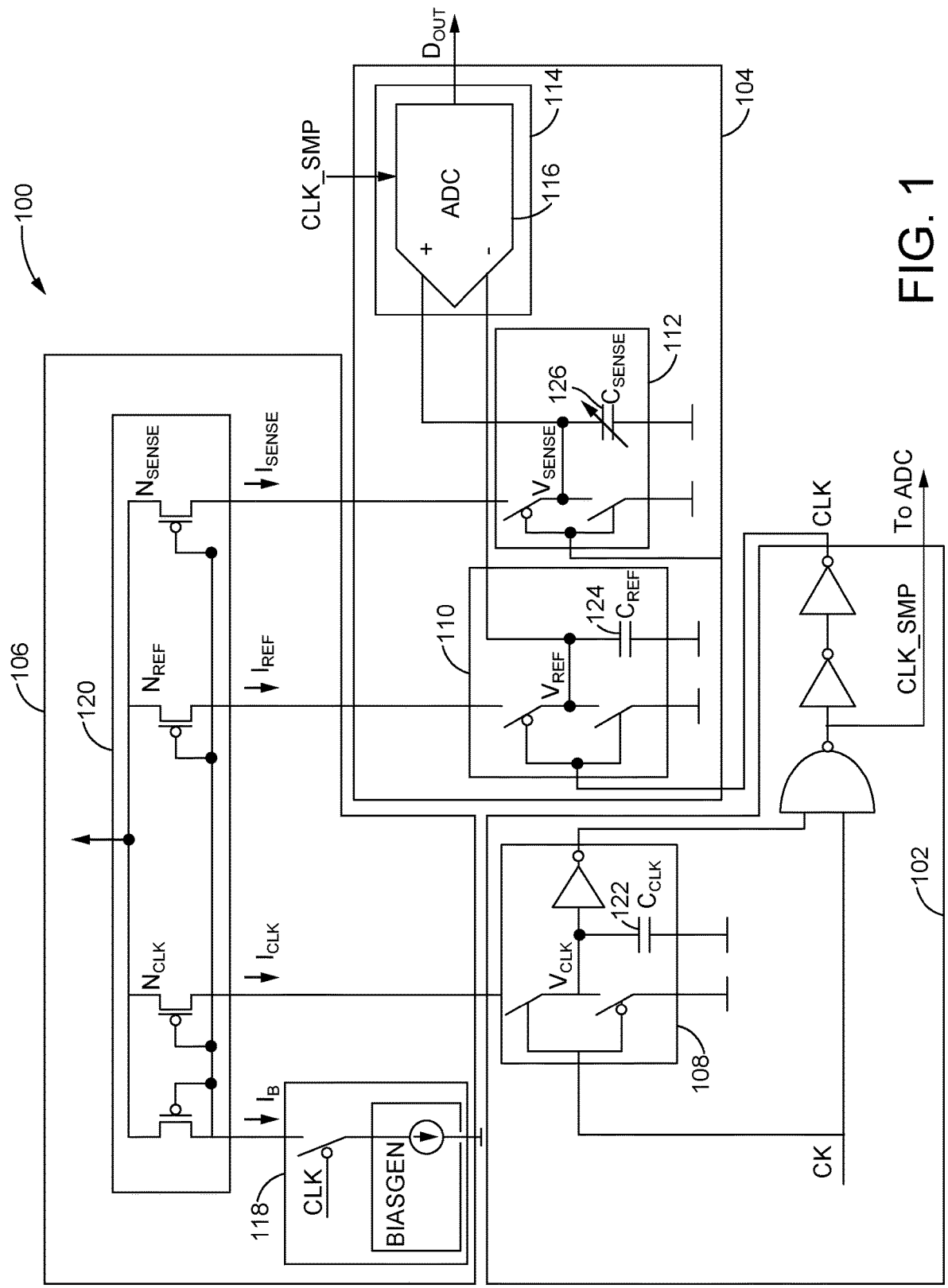
FIG. 1 is a schematic view of one exemplary capacitive sensor device or circuitry of the present disclosure.

Referring to FIG. 1, one exemplary embodiment of a capacitive sensor readout circuit or capacitive sensor device 100 is diagrammatically provided. In general, the capacitive sensor device 100 may be used to monitor for changes in capacitance responsive to capacitive sensor input, such as touch or proximity of a human finger, and provide a digital readout corresponding to the detected capacitive sensor input. Moreover, the capacitive sensor device 100 shown may be incorporated or implemented within mobile or battery-operated devices, or any other form of electronic devices configured to receive some form of capacitive sensor input from a user, and perform a preprogrammed task in response to the capacitive sensor input. As shown, the capacitive sensor device 100 may generally include a clock module 102, a sensor module 104, a current supply module 106, and any other supporting circuitry. Although only certain arrangements of the capacitive sensor device 100 are shown, it will be understood that other arrangements and variations are possible.

As shown in FIG. 1, the clock module 102 may include a clock circuit 108 that is configured to receive a system clock CK, and ultimately generate a clock signal CLK, that is used to operate each of the sensor module 104 and the current supply module 106. The sensor module 104 may include a reference circuit 110 configured to generate a reference signal $V_{REF}$, a sense circuit 112 configured to generate a sense signal $V_{SENSE}$, and a sample circuit 114 configured to sample a difference between the reference signal $V_{REF}$, and the sense signal $V_{SENSE}$, according to the clock signal CLK. In particular, the sensor module 104 may employ an analog-to-digital convertor (ADC) 116 configured to sample for differences in capacitance exhibited by the reference signal $V_{REF}$ and the sense signal $V_{SENSE}$, and generate or output a digitized value $D_{OUT}$ corresponding to the difference in capacitance and capacitive sensor input. The ADC 116 may be enabled based on the clock signal CLK, or clock sample signal CLK_SMP.

Furthermore, the current supply module 106 of FIG. 1 may include a bias current circuit 118, and a multiplier circuit 120. The bias current circuit 118 may be configured to selectively generate a bias current $I_B$ according to the clock signal CLK. The multiplier circuit 120 may be configured to supply current to each of the clock circuit 108, the reference circuit 110, and the sensor circuit 112 based on the bias current $I_B$ and according to the clock signal CLK. More specifically, the multiplier circuit 120 may employ a current mirror or the like, which copies the bias current $I_B$, and multiplies the bias current $I_B$ to generate three different current signals $I_{CLK}$, $I_{REF}$ and $I_{SENSE}$. The first copied current signal $I_{CLK}$ may be used to charge a clock capacitor 122 having a clock capacitance $C_{CLK}$, the second copied current signal $I_{REF}$ may be used to charge a reference capacitor 124 having a reference capacitance $C_{REF}$, and the third copied current signal $I_{SENSE}$ may be used to charge a sense capacitor 126 having a sense capacitance $C_{SENSE}$.

In the embodiment shown, each of the clock capacitor 122 and the reference capacitor 124 in FIG. 1 may be sized to be significantly smaller in capacitance than the sense capacitor 126, so as to improve sensitivity to capacitive sensor input while maintaining low power consumption. In some embodiments, an input capacitance of the ADC 116 may be used instead of the reference capacitance $C_{REF}$. Additionally, the multiplier circuit 120 may be configured to copy and multiply the bias current $I_B$ by predefined factors $N_{CLK}$, $N_{REF}$ and $N_{SENSE}$ to respectively charge each of the clock capacitor 122, the reference capacitor 124, and the sense capacitor 126. Furthermore, the bias current circuit 118 may be configured to generate the bias current $I_B$ only during charging of each of the clock capacitor 122, the reference capacitor 124, and the sense capacitor 126, as determined for instance by the clock signal CLK. In addition, the sense circuit 112 may be configured to vary the sense signal $V_{SENSE}$ in response to capacitive sensor input such that the difference between the reference signal $V_{REF}$ and the sense signal $V_{SENSE}$ corresponds to a magnitude of the capacitive sensor input.

Figure 2:
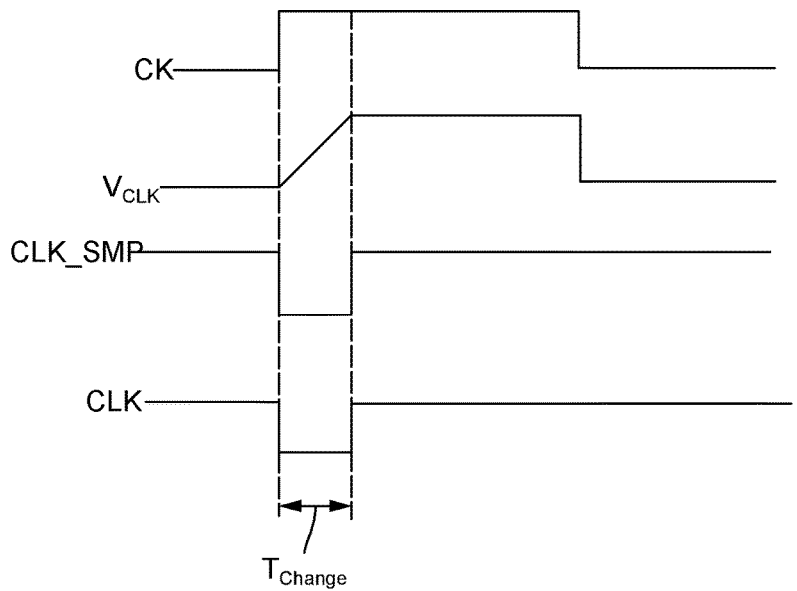
FIG. 2 is a diagrammatic view of one timing diagram of the capacitive sensor device of the present disclosure.

In accordance with the arrangement shown in FIG. 1, and with reference to the timing diagrams of FIG. 2, the clock capacitance $C_{CLK}$ may be charged by the first copied current signal $I_{CLK}$, defined by $I_{CLK}=N_{CLK}I_B$, such that $$V_{CLK} = \frac{I_{CLK}T_{Charge}}{C_{CLK}} = \frac{N_{CLK}I_B T_{Charge}}{C_{CLK}}, \quad (1)$$

$$T_{Charge} = \frac{V_{CLK}C_{CLK}}{N_{CLK}I_B} = \frac{N_{CLK}I_B T_{Charge}}{C_{CLK}}, \text{ and} \quad (2)$$

$$V_{CLK} = V_{SUPL} - V_{CLK,THR}, \quad (3)$$

where $T_{CHARGE}$ is the period for charging capacitors $C_{CLK}$, $C_{REF}$ and $C_{SENSE}$, where $V_{SUPL}$ is the supply voltage, and where $V_{CLK,THR}$ is a threshold voltage that is significantly less than $V_{SUPL}$. Correspondingly, charging the reference capacitance $C_{REF}$ with the second copied current signal $I_{REF}$, and charging the sense capacitance $C_{SENSE}$ with the third copied current signal $I_{SENSE}$, provides $$V_{REF} = \frac{N_{REF}I_B T_{Charge}}{C_{REF}} = \frac{N_{REF}}{C_{REF}} \cdot \frac{C_{CLK}}{N_{CLK}}(V_{SUPL} - V_{CLK,THR}), \quad (4)$$

$$V_{SENSE} = \frac{N_{SENSE}I_B T_{Charge}}{C_{SENSE}} = \frac{N_{SENSE}}{C_{SENSE}} \cdot \frac{C_{CLK}}{N_{CLK}}(V_{SUPL} - V_{CLK,THR}), \quad (5)$$

where $N_{CLK}$, $N_{REF}$ and $N_{SENSE}$ are discrete integers.

As shown in FIG. 2, during operation, when the system clock CK changes from logical low to logical high, the clock signal CLK and the clock sample signal CLK_SMP become logical low, and thereby enables the bias current $I_B$. Enabling the bias current $I_B$ further enables each of the copied current signals $I_{CLK}$, $I_{REF}$ and $I_{SENSE}$ to begin respectively charging each of the clock capacitor 122, the reference capacitor 124 and the sense capacitor 126 for a duration of $T_{CHARGE}$. When the voltage $V_{CLK}$ across the clock capacitor 122 reaches $V_{CLK}=V_{SUPL}-V_{CLK,THR}$, the clock sample signal CLK_SMP returns to logical high to engage the ADC 116 to sample the difference between voltage $V_{REF}$ and $V_{SENSE}$ respectively across the reference capacitor 124 and the sense capacitor 126. After sampling, the clock signal CLK returns to logical high, the bias current signal $I_B$ falls to 0 A, and each of the reference capacitance $C_{REF}$ and the sense capacitance $C_{SENSE}$ is discharged to 0 V.

Correspondingly, the clock capacitance $C_{CLK}$ in FIG. 1 may be discharged to 0 V when the system clock signal CK becomes logical low, and the capacitive sensor device 100 may be completely shut down until the next rising edge of the system clock signal CK, or when the next sample of the sense capacitance $C_{SENSE}$ should be taken. Based on the foregoing, the digitized value $D_{OUT}$ output by the ADC 116 may be expressed by $$D_{OUT} = Q\left[\frac{V_{SENSE}-V_{REF}}{KV_{SUPL}}\right] = Q\left[\frac{V_{SUPL}-V_{CLK,THR}}{KV_{SUPL}} \cdot \frac{C_{TOP}}{N_{TOP}}\left(\frac{N_{SENSE}}{C_{SENSE}}-\frac{N_{REF}}{C_{REF}}\right)\right]. \tag{6}$$

where Q denotes the quantization of the bracketed expression, and where $KV_{SUPL}$ denotes the reference voltage of the ADC 116. Notably, the expression for the digitized value $D_{OUT}$ illustrates that the readout is independent of the input or bias current $I_B$, and thus, independent of changes in the bias current $I_B$ caused by variances in temperature, noise such as white noise, 1/f-noise and other noise sources, and manufacturing tolerances. Furthermore, the sensitivity to variances in the supply voltage is also low.

Other variations or modifications to the capacitance sensor device 100 of FIG. 1 may be provided. In one modification, each of the predefined factors $N_{CLK}$, $N_{REF}$ and $N_{SENSE}$ may be digitally set as a response to the digitized value $D_{OUT}$ output by the ADC 116. Moreover, the predefined factors may be set according to predetermined algorithms, or the like, configured to calibrate or recalibrate the capacitive sensor device 100 for the given conditions and to prevent the sensitivity of the capacitive sensor device 100 from drifting out of optimal range. For example, the individual values for the predefined factors $N_{CLK}$, $N_{REF}$ and $N_{SENSE}$ may be calculated during a startup calibration algorithm and/or a calibration algorithm operating in the background while the capacitive sensor device 100 is reading the capacitance over one or more samples.

Figure 3:
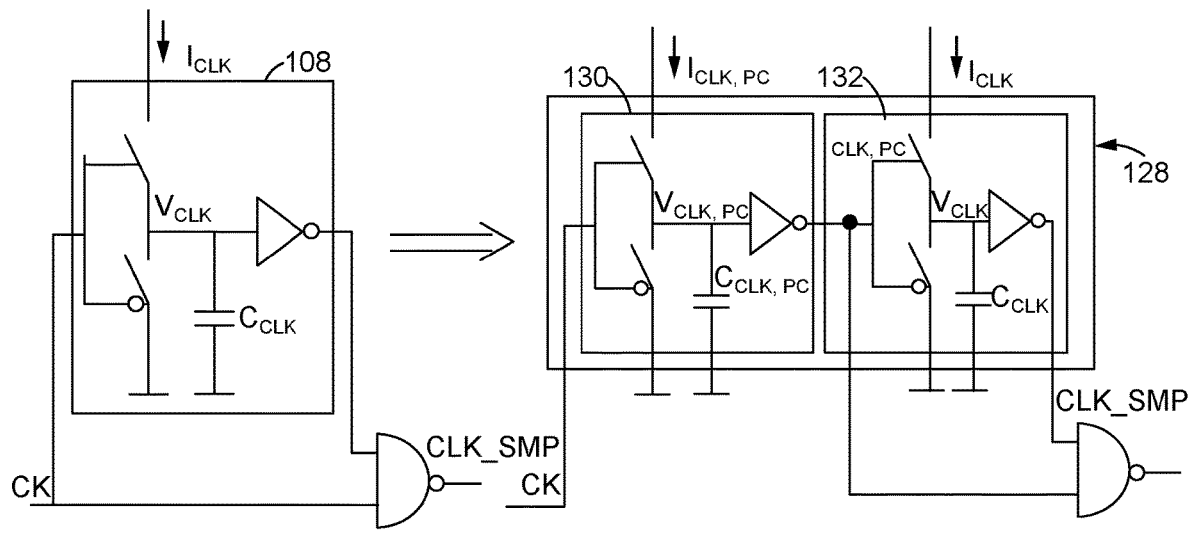
FIG. 3 is a schematic view of another clock circuit that may be implemented with the capacitive sensor device of the present disclosure.
Figure 4:
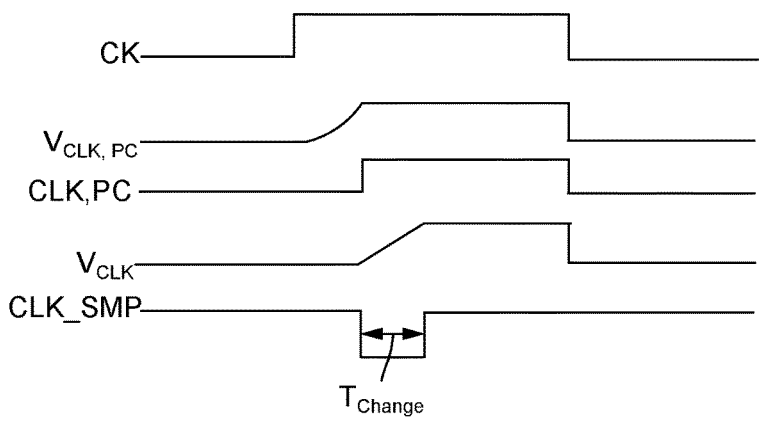
FIG. 4 is a diagrammatic view of another timing diagram of the capacitive sensor device of the present disclosure.

In another modification, the clock circuit 108 of FIG. 1 may be replaced with the clock circuit 128 shown in FIG. 3, which may essentially include two clock circuits 130, 132, each similar to the clock circuit 108 of FIG. 1, coupled together in series. As further demonstrated by the timing diagrams in FIG. 4, the first clock circuit 130 may be charged via another copied current signal $I_{CLK,PC}$ which may serve as a pre-charge current. The second clock circuit 132 may be enabled by the first clock circuit 130 when the pre-charge voltage $V_{CLK,PC}$ is charged to the threshold voltage $V_{SUPL}-V_{CLK,PC,THR}$, and the point at which the clock sample signal CLK_SMP becomes logical low and charging begins. The charging continues for the duration of the charge period $T_{CHARGE}$ and until $V_{CLK}$ is then reaches its threshold $V_{SUPL}-V_{CLK,THR}$. At the end of the charge period $T_{CHARGE}$, the clock sample signal CLK_SMP returns to logical high and sampling commences. As in FIG. 1, the clock signal CLK is a delayed version of clock sample signal CLK_SMP. When the clock signal CLK returns to logical high, charging ceases and the capacitances $C_{REF}$ and $C_{SENSE}$ are discharged. Both clock circuits 130, 132 are further reset when the system clock CK becomes logical low.

In another modification, a voltage buffer may be applied to the sense signal $V_{SENSE}$. For instance, a voltage buffer may be disposed between the sense capacitor 126 and the input of the ADC 116, to prevent the input of the ADC 116 to load and lower the sensitivity of the capacitive sensor device 100. This may be especially important when the sense capacitance $C_{SENSE}$ may not be much greater than an input capacitance of the ADC 116. Such a voltage buffer may require a bias current that is supplied only during the charge period $T_{CHARGE}$, such that the buffer is on only while charging the reference capacitor 124 and the sense capacitor 126, according to the embodiment of FIG. 1 for example. In the embodiment shown in FIG. 3, however, the bias current for a voltage buffer may be enabled when the first clock circuit 130 begins to charge, and disabled when the clock signal CLK becomes logical high at the end of the charge period $T_{CHARGE}$. This would enable the voltage buffer time to settle the internal bias currents before charging begins.

Figure 5:
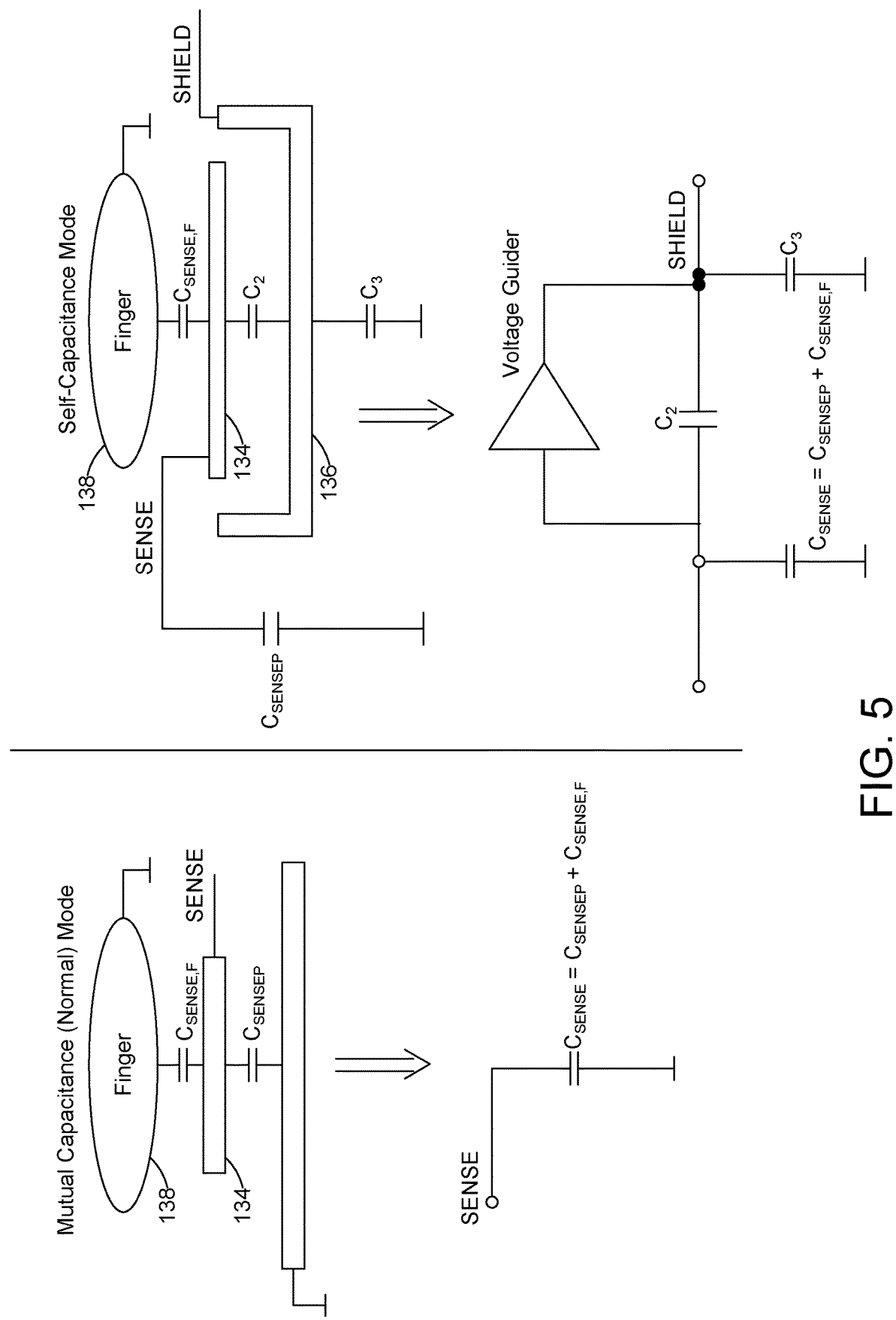
FIG. 5 is a schematic view of another sense circuit that may be implemented with the capacitive sensor device of the present disclosure.

In still another modification, and with reference to FIG. 5, the sense circuit 112 may provide, in addition to a default sensor plate 134, a sensor shield 136. For example, a voltage buffer may be added to copy the sense signal $V_{SENSE}$ to form a shield signal $V_{SHIELD}$ used to drive the sensor shield 136, which may enable the capacitive sensor device 100 to operate in a self-capacitance mode with increased sensitivity. In particular, self-capacitance modes may provide the sensitivity needed to detect small variations in capacitance caused by the proximity of an object rather than capacitive sensor input. The diagram in FIG. 5 compares the mutual capacitance mode of the embodiment of FIG. 1 to the self-capacitance mode of a shielded arrangement. As shown, the mutual capacitance mode exhibits a sense capacitance $C_{SENSE}$, that is the sum of a fixed parasitic capacitance $C_{SENSE,0}$ between the sensor plate 134 and ground, and the capacitance $C_{SENSE,F}$ between the sensor plate 134 and a finger or other object 138.

According to the mutual capacitance example of FIG. 5, the relatively large fixed parasitic capacitance $C_{SENSE,0}$ and the relatively large distance between the object 138 and the sensor plate 134 renders the capacitance $C_{SENSE,F}$ to be very small when used as a proximity sensor. Moreover, the digitized value $D_{OUT}$ output by the ADC 116 becomes too insensitive to the slight changes in capacitance induced by mere proximity. However, by using the self-capacitance mode of FIG. 5, and by substantially surrounding the sides and bottom surface of the sensor plate 134 with the sensor shield 136, the fixed capacitance $C_{SENSE,0}$ can be made relatively very small. For example, using a voltage buffer to copy the sense signal $V_{SENSE}$ to the shield signal $V_{SHIELD}$ offsets the capacitance $C_2$ formed between the sensor plate 134 and the sensor shield 136 improves overall sensitivity for proximity applications. In actual implementation, the sensor shield 136 may also surround a node extending between the sensor plate 134 and the capacitive sensor device 100. Furthermore, such a voltage buffer may be supplied with a bias current using any of the techniques described above.

Figure 6:
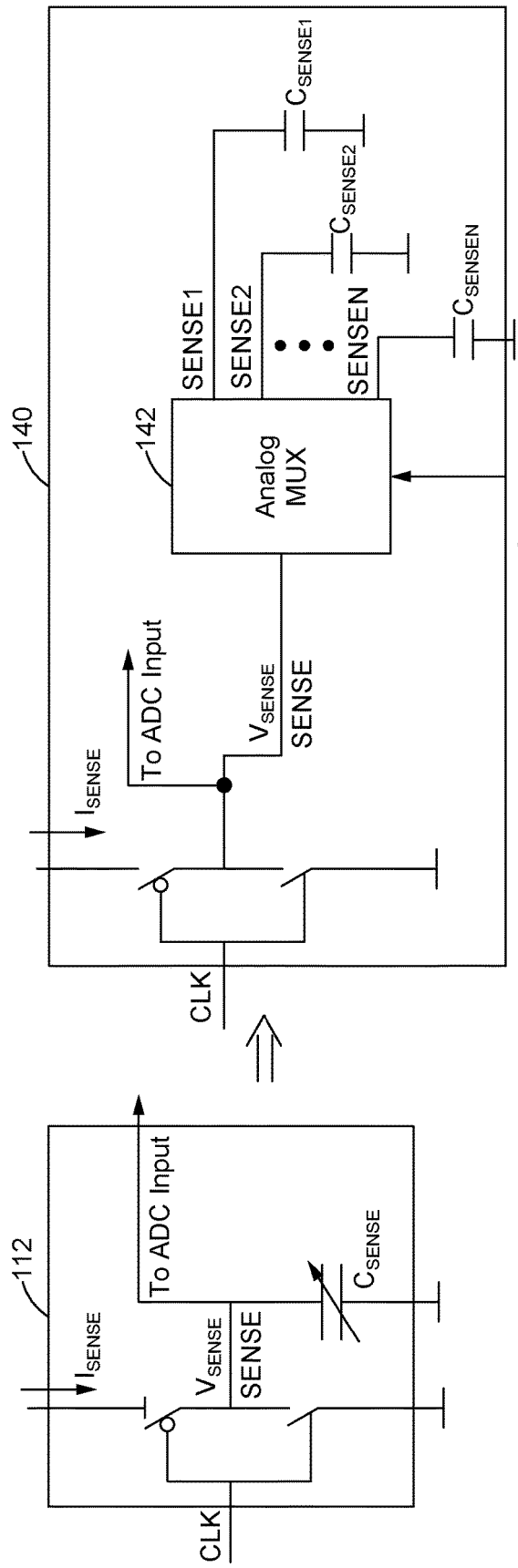
FIG. 6 is a schematic view of another sense circuit that may be implemented with the capacitive sensor device of the present disclosure.
Figure 7:
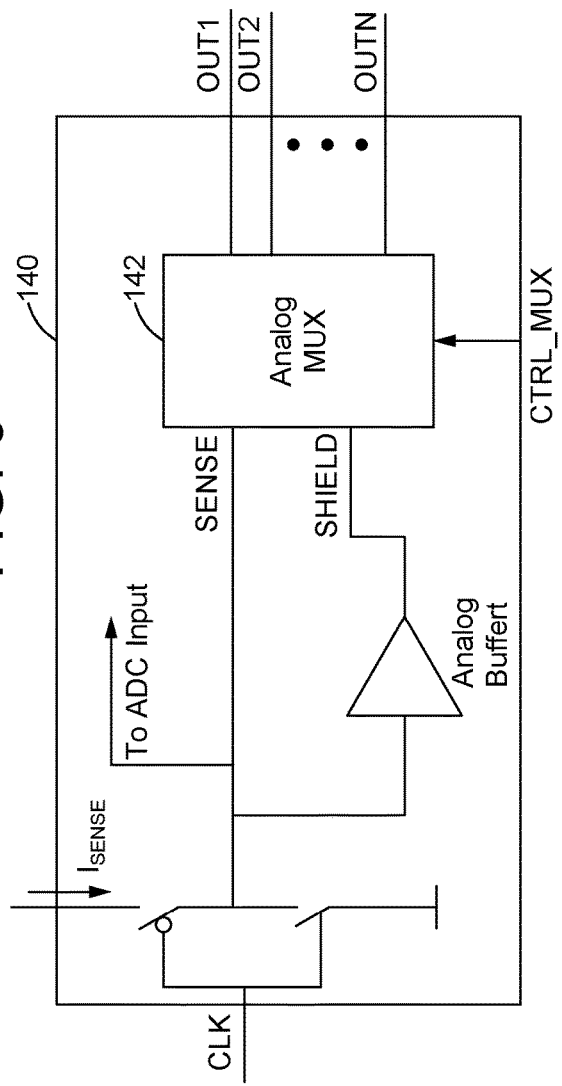
FIG. 7 is a schematic view of yet another sense circuit that may be implemented with the capacitive sensor device of the present disclosure.

In yet another embodiment, the sense circuit 112 of FIG. 1 may be replaced with the modified sense circuit 140 show in FIGS. 6 and 7, for instance, to access and provide readouts for more than one sense capacitor 126 by incorporating an analog multiplexer (MUX) 142, or the like. As demonstrated in FIG. 6, for instance, one analog input of the MUX 142 may be coupled to the sense signal $V_{SENSE}$ of FIG. 1, and two or more analog outputs of the MUX 142 may be coupled to two or more additional sense capacitors 126. A digital input signal CTRL_MUX may be used to select the sense capacitors 126 to access at any given moment. Similarly, as shown in FIG. 7, a MUX 142 may also employ the shielded arrangement of FIG. 5. For instance, the MUX 142 may include two analog inputs, one coupled to the sense signal $V_{SENSE}$ and one coupled to the shield signal $V_{SHIELD}$. The MUX 142 may also include two or more analog outputs, which can also be individually accessed using the digital input signal CTRL_MUX.

In still further variations, the ADC 116 of FIG. 1 may be replaced with, or implemented with, a built-in trigger circuit configured with one or more trigger values against which an analog input can be compared. The trigger circuit outputs may be the result of the comparison between the analog input and the predefined trigger values. Further still, other modifications can be made to attenuate the effects of external disturbance, such as, but not limited to, stray currents inconsistently charging sense capacitors 126, variations in capacitance charge due to electromagnetic fields or related interference, and the like. For instance, the input bias current $I_B$ may be optimized such that the charge period $T_{CHARGE}$ may be adjusted to attenuate such interference and to optimize sensitivity to touch, proximity, or other capacitive sensor input. While only certain arrangements and embodiments are shown, it will be understood that other variations can be implemented to provide comparable results.

Figure 8:
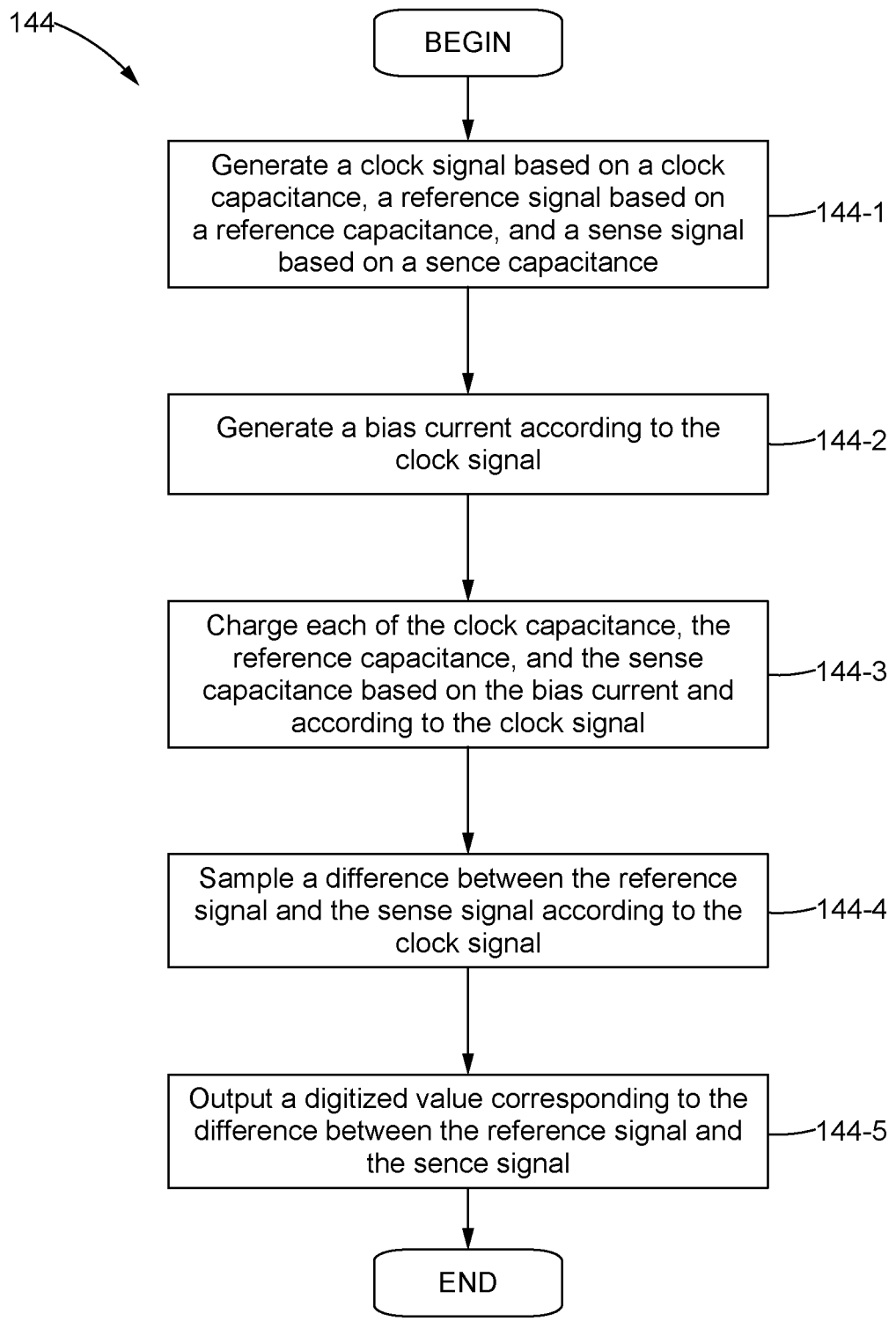
FIG. 8 is a flow diagram of one exemplary scheme or method of sensing a change in capacitance sensitive to capacitive sensor input.

Turning now to FIG. 8, one exemplary method 144 of sensing a change in capacitance or capacitive sensor input is provided. The method 144, or any one or more processes thereof, may be implemented in a variety of different ways, such as using one or more of algorithms, instructions, logic operations, and the like, and/or using digital circuitry, analog circuitry, or combinations thereof. As shown in FIG. 8, and in conjunction with the embodiments discussed in FIGS. 1-7 above, the method 144 in block 144-1 may initially generate a clock signal CLK based on a clock capacitance $C_{CLK}$, a reference signal $V_{REF}$ based on a reference capacitance $C_{REF}$, and a sense signal $V_{SENSE}$ based on a sense capacitance $C_{SENSE}$. As discussed above, each of the clock capacitance $C_{CLK}$ and the reference capacitance $C_{REF}$ may be sized to be significantly smaller than the sense capacitance $C_{SENSE}$. Furthermore, the sense capacitance $C_{SENSE}$ may be configured to vary in response to capacitive sensor input.

Still referring to FIG. 8, the method 144 may be configured to generate a bias current $I_B$ according to the clock signal CLK in block 144-2, and charge each of the clock capacitance $C_{CLK}$, the reference capacitance $C_{REF}$, and the sense capacitance $C_{SENSE}$ based on the bias current $I_B$ and according to the clock signal CLK in block 144-3. More specifically, the method 144 may generate the bias current $I_B$ only when charging each of the clock capacitance $C_{CLK}$, the reference capacitance $C_{REF}$, and the sense capacitance $C_{SENSE}$. Furthermore, the bias current $I_B$ may be copied and multiplied by predefined factors $N_{CLK}$, $N_{REF}$ and $N_{SENSE}$, and the copied current signals $I_{CLK}$, $I_{REF}$ and $I_{SENSE}$ may be used to respectively charge each of the clock capacitance $C_{CLK}$, the reference capacitance $C_{REF}$, and the sense capacitance $C_{SENSE}$. As discussed above, each of the predefined factors $N_{CLK}$, $N_{REF}$ and $N_{SENSE}$ may also be digitally set as a response to the digitized value $D_{OUT}$ output by the ADC 116.

The method 144 of FIG. 8 may further be configured to sample a difference between the reference signal $V_{REF}$ and the sense signal $V_{SENSE}$ according to the clock signal CLK in block 144-4. For example, the difference between the reference signal $V_{REF}$ and the sense signal $V_{SENSE}$ may correspond to a magnitude of the capacitive sensor input detected by the variable sense capacitance $C_{SENSE}$. The method 144 in block 144-5 may further be configured to output a digitized value $D_{OUT}$ which corresponds to the difference between the reference signal $V_{REF}$ and the sense signal $V_{SENSE}$. Moreover, the digitized value $D_{OUT}$ may be configured not only to correspond to a magnitude of the capacitive sensor input, but also to be substantially independent of variances in the bias current $I_B$ caused by variances in temperature, supply voltage, and/or interference due to noise, white noise, 1/f noise, and the like. Furthermore, any one or more processes of the method 144 shown in FIG. 8 may be reiterated per cycle of the system clock CK or some other desired frequency.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:

1. A method of sensing a change in capacitance sensitive to capacitive sensor input, comprising:
    generating a clock signal based on a first capacitance, a reference signal based on a second capacitance, and a sense signal based on a third capacitance;
    generating a bias current according to the clock signal, wherein the bias current is copied and multiplied by a predefined factor, and each of the first capacitance, the second capacitance, and the third capacitance is charged using the copied and multiplied bias current;
    charging each of the first capacitance, the second capacitance, and the third capacitance based on the bias current and according to the clock signal; and
    sampling a difference between the reference signal and the sense signal according to the clock signal.

2. The method of claim 1, wherein each of the first capacitance and the second capacitance is sized to be significantly smaller than the third capacitance.

3. The method of claim 1, wherein the bias current is generated only when charging each of the first capacitance, the second capacitance, and the third capacitance.

4. The method of claim 1, wherein the third capacitance varies in response to capacitive sensor input.

5. The method of claim 4, wherein the difference between the reference signal and the sense signal corresponds to a magnitude of the capacitive sensor input.

6. The method of claim 4, wherein the difference between the reference signal and the sense signal corresponds to a magnitude of the capacitive sensor input.

7. The method of claim 1, further outputting a digitized value corresponding to the difference between the reference signal and the sense signal.

8. The method of claim 7, wherein the digitized value corresponds to a magnitude of the capacitive sensor input and is independent of changes in the bias current.

9. The method of claim 7, wherein the digitized value corresponds to a magnitude of the capacitive sensor input and is independent of changes in the bias current.

10. The method of claim 1, further outputting a digitized value corresponding to the difference between the reference signal and the sense signal.

11. A non-transient computer-readable medium having stored thereon computer-executable instructions for sensing a change in capacitance sensitive to capacitive sensor input, the computer-executable instructions comprising instructions for:
generating a clock signal based on a first capacitance, a reference signal based on a second capacitance, and a sense signal based on a third capacitance;
generating a bias current according to the clock signal, wherein the bias current is copied and multiplied by a predefined factor, and each of the first capacitance, the second capacitance, and the third capacitance is charged using the copied and multiplied bias current;
charging each of the first capacitance, the second capacitance, and the third capacitance based on the bias current and according to the clock signal; and
sampling a difference between the reference signal and the sense signal according to the clock signal.

12. The method of claim 11, wherein each of the first capacitance and the second capacitance is sized to be significantly smaller than the third capacitance.

13. The method of claim 11, wherein the bias current is generated only when charging each of the first capacitance, the second capacitance, and the third capacitance.

14. The method of claim 11, wherein the third capacitance varies in response to capacitive sensor input.

* * * * *